United States Patent
Malek et al.

(10) Patent No.: US 8,952,272 B2
(45) Date of Patent: Feb. 10, 2015

(54) MOLDED EMI AND THERMAL SHIELD

(71) Applicant: Apple Inc., Cupertino, CA (US)

(72) Inventors: Shayan Malek, San Jose, CA (US);
Scott A. Myers, San Francisco, CA (US); Michael B. Wittenberg, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/631,236

(22) Filed: Sep. 28, 2012

(65) Prior Publication Data

US 2013/0233611 A1 Sep. 12, 2013

Related U.S. Application Data

(60) Provisional application No. 61/607,770, filed on Mar. 7, 2012.

(51) Int. Cl.
*H05K 9/00* (2006.01)

(52) U.S. Cl.
USPC .................. 174/382; 174/384; 361/818

(58) Field of Classification Search
USPC .................. 174/382, 384; 361/816, 818
See application file for complete search history.

(56) References Cited

U.S. PATENT DOCUMENTS

| | | | |
|---|---|---|---|
| 5,614,694 A | 3/1997 | Gorenz, Jr. et al. | |
| 6,320,121 B1 | 11/2001 | Honeycutt et al. | |
| 6,673,998 B1 * | 1/2004 | Wu ........................ | 174/383 |
| 6,796,485 B2 * | 9/2004 | Seidler ..................... | 228/255 |
| 7,095,624 B2 * | 8/2006 | Daoud et al. ............ | 361/800 |
| 7,486,517 B2 | 2/2009 | Aapro et al. | |
| 7,506,436 B2 | 3/2009 | Bachman | |
| 7,965,514 B2 | 6/2011 | Hill et al. | |
| 8,270,167 B2 | 9/2012 | Greenwood et al. | |
| 2004/0217472 A1 | 11/2004 | Aisenbrey et al. | |
| 2009/0122507 A1 * | 5/2009 | Snider ..................... | 361/818 |
| 2009/0244876 A1 | 10/2009 | Li et al. | |
| 2011/0056742 A1 | 3/2011 | Shen | |
| 2011/0242764 A1 | 10/2011 | Hill et al. | |
| 2012/0313032 A1 | 12/2012 | Kim et al. | |
| 2013/0048369 A1 | 2/2013 | Malek et al. | |
| 2013/0077282 A1 | 3/2013 | Malek et al. | |

FOREIGN PATENT DOCUMENTS

WO 2010093100 8/2010

OTHER PUBLICATIONS

Malek et al., U.S. Appl. No. 13/222,179, filed Aug. 31, 2011.

* cited by examiner

*Primary Examiner* — Hung V Ngo
(74) *Attorney, Agent, or Firm* — Kendall P. Woodruff

(57) ABSTRACT

One embodiment of a molded shield can include a cavity to conform to and receive an electrical component, a slit to conform to and receive a metal frame and a metal layer coupled to the top and lateral sides of the molded shield. In one embodiment, the molded shield can be formed from silicon and can include material to enhance electrical conductivity. The molded shield can couple to the metal frame which in turn can be coupled to ground with the resulting configuration acting to reduce electrical emissions. The molded shield can transfer heat away from the electrical component through conduction.

20 Claims, 5 Drawing Sheets

MOLDED EMI AND THERMAL SHIELD

CROSS-REFERENCE TO RELATED APPLICATION

This application claims the benefit of prior filed U.S. Provisional Patent Application No. 61/607,770, filed Mar. 7, 2012, which is incorporated by reference herein in its entirety.

BACKGROUND

Electronic components can emit electromagnetic interference (EMI) or radio frequency interference (RFI) signals. Typically, there are restrictions set forth by governmental agencies regarding the amount of permissible EMI or RFI emissions. Exceeding these restrictions can ban a product from sales or restrict operation of a product that includes the electronic component.

Electronic components oftentimes dissipate heat and are specified with allowable operating temperatures. Operating beyond these temperatures can cause erratic behavior or component failure. Thus, proper functioning of electronic components can rely on how well heat can be dissipated in a design.

Common approaches to controlling EMI and RFI emissions employ a metal shield shaped to surround one or more electronic components. Properly configured, the metal shield can capture and dissipate spurious EMI and RFI emissions conducting them to ground or other reference point. Such shields, however often must provide space between the shield and the electronic component to allow air to circulate and cool the component. The air circulation space can increase required space above the electronic component and thereby increase the size of the final product.

Therefore, what is desired is a low profile shield capable of reducing EMI and RFI emissions and able to dissipate heat from shielded electronic components.

SUMMARY

Systems and methods for shielding components in an electronic device are provided.

In some embodiments, there may be provided a shield system that may include a printed circuit board (PCB), the PCB including a top surface and a bottom surface. The system may also include an electrical component affixed to the top surface PCB, a metal frame affixed to the top surface of the PCB and surrounding the electronic component, and a silicone shield. The shield may include a top side and a bottom side, disposed on the electrical component, wherein the bottom side may include a cavity shaped to accept the electrical component and the cavity may come in direct contact with the electronic component on at least one surface, and a slit configured to accept the metal frame. The system may also include a metal layer arranged to conform to the top side of the silicone shield, wherein the metal layer may be disposed in direct contact with the top side of the silicone shield. The system may also include a midplate disposed above the top surface of the PCB board and above the metal layer. For example, in some embodiments, the cavity may come in direct contact with the electronic component on at least two surfaces of the electronic component. For example, in some embodiments, the bottom side of the shield at the cavity may come in direct contact with a top surface and at least one side surface of the electronic component. For example, in some embodiments, the midplate may include a heat sink. For example, in some embodiments, the silicone shield at the slit may come in direct contact with the metal frame.

In some other embodiments, there may be provided a shield that may include a silicone shield body. The body may include a top side, a bottom side, and at least one lateral side extending between the top side and the bottom side. The bottom side may include a cavity configured to accept an electrical component, and the bottom side may include a slit configured to accept a frame. For example, in some embodiments, the slit may be separated from the cavity by a portion of the shield body. For example, in some embodiments, the slit may surround the cavity. For example, in some embodiments, the silicone shield body may include additives to increase the ability to reduce interference. For example, in some embodiments, the silicone shield body may include at least one of a copper additive, a zinc additive, and a nickel additive.

In some other embodiments, there may be provided a method that may include determining dimensions of a component to be shielded, preparing a mold cavity based on the determined dimensions of the component, determining outside dimensions of a shield, preparing a mold core based on the determined outside dimensions, and molding a silicone shield using the prepared mold cavity and the prepared mold core. For example, in some embodiments, the method may also include preparing a chamfer-forming member along the prepared mold cavity before the molding, where the molded silicone shield may include a slit based on the chamfer-forming member. For example, in some embodiments, the method may also include cutting along a chamfer of the molded silicone shield for forming a slit. For example, in some embodiments, the method may also include inserting a metal foil into the prepared mold core prior to the molding.

In some other embodiments, there may be provided a system that may include a mounting surface, an electrical component positioned above the mounting surface, a frame positioned above the mounting surface and about at least a portion of the electronic component, and a shield. The shield may include a top side, a bottom side, a cavity in the bottom side receiving the electrical component, and a slit in the bottom side receiving the frame. For example, in some embodiments, the shield at the cavity may directly contact the received electrical component along at least one surface of the electrical component. For example, in some embodiments, the shield at the cavity may directly contact the received electrical component along a top surface of the electrical component and along at least one side surface of the electrical component. For example, in some embodiments, the shield at the slit may directly contact the received frame. For example, in some embodiments, the shield may include silicone and the frame may include metal. For example, in some embodiments, the system may further include a metal layer disposed in direct contact with the top side of the shield, and/or a heat sink disposed in direct contact with the top side of the shield.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF SELECTED EMBODIMENTS

Figure 1:
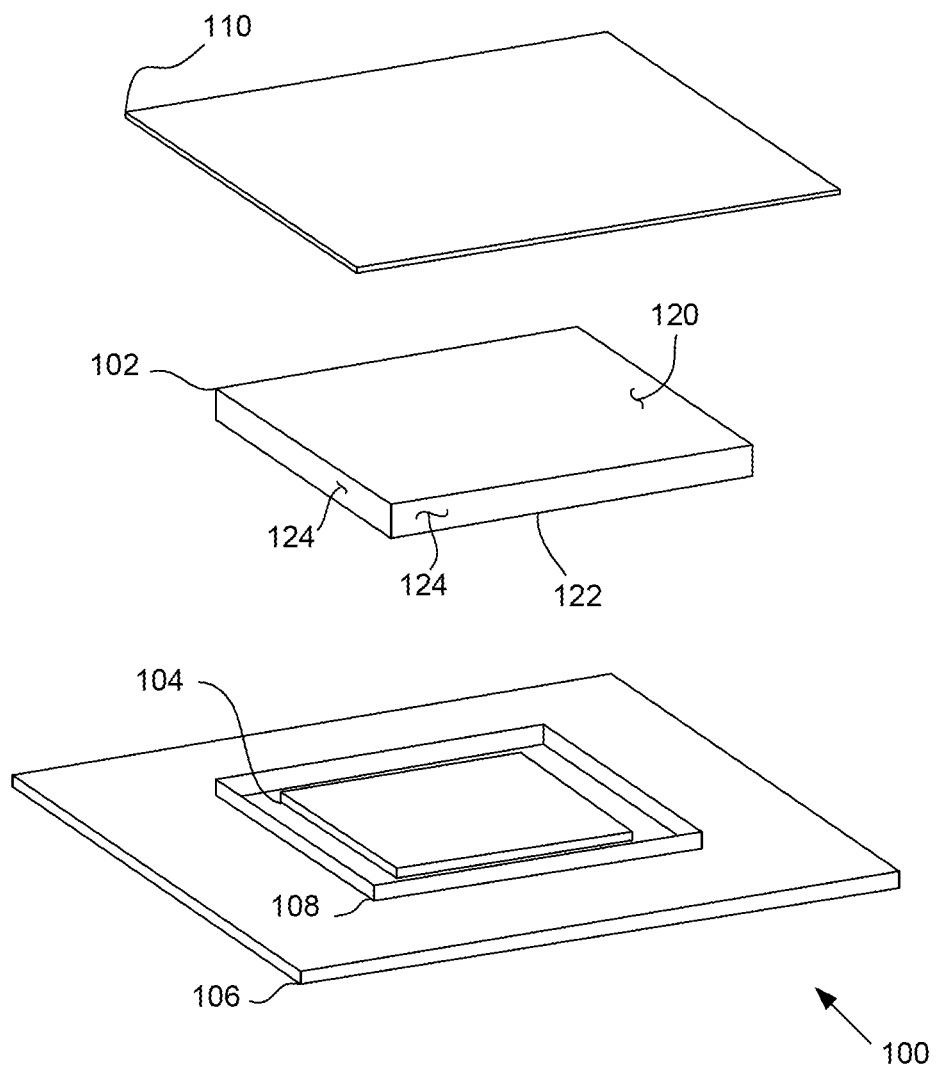
FIG. 1 is an expanded diagram of one embodiment of a shield system.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Electronic components often have two characteristics that can adversely affect a product design. First of all, electrical components can produce EMI and RFI interfering emissions greater than an amount allowed by various regulating agencies. Secondly, electrical components often consume power and therefore need to dissipate heat. If not properly cooled, electrical components can operate incorrectly or fail. Although traditional metal-formed EMI/RFI shields can reduce EMI/RFI emissions, they can also have a negative impact in product design by requiring additional volume to implement. For example, metal-formed shields must often be designed to allow air to circulate around components within the shield to enable component cooling and thereby increase product size. Product size can be particularly important, especially when the product is meant to be highly portable.

In one embodiment, the functionality of an EMI/RFI shield can be combined with a thermal heat sink. Such a combined device can not only reduce electrical emissions but also help transfer heat away from electronic components and protect ongoing operations of the component. One example of such a combined device is a molded shield that combines EMI and RFI emission reduction with heat reduction. In one embodiment, the molded shield can be made from silicone or a silicone-like material. In another embodiment, the molded shield can include metallic or semi-metallic material with the silicone to help increase the conductive properties of the molded shield and enhance EMI/RFI attenuation. Such metallic and semi metallic materials can include copper, zinc, nickel or other like material. In one embodiment, the molded shield can have two sides. A first side can be configured to receive a cavity to fit upon and receive one or more electronic components. In another embodiment, the first side can include a slit to receive a metal frame. The metal frame can couple the molded shield to a voltage potential such as ground. The molded shield can act as a heat sink and conduct heat away from one or more electronic components. The molded shield can be placed under other components to further improve heat dissipation. In one embodiment, a second side can be configured to receive a thin foil layer to further enhance EMI and RFI emission reduction. The molded shield can be smaller than traditional formed metal solutions while still offering heat dissipation.

FIG. 1 is an expanded diagram of one embodiment of shield system 100. Shield system 100 can include molded shield 102, printed circuit board (PCB) 106, electrical component 104, metal frame 108 and midplate 110. Electrical component 104 can include an integrated circuit such as a processor or memory or other electronic device. PCB 106 can be a fiberglass substrate, semi-rigid circuit, flex circuit or other suitable material for mounting electronic component 104. Metal frame 108 and electrical component 104 can be attached to one side of PCB 106.

PCB 106 can include signals (carried through traces, for example) for electrical component 104. In one embodiment, a voltage potential, such as a ground signal can be coupled to metal frame 108. Molded shield 102 can fit over electrical component 104 and metal frame 108. In one embodiment, molded shield 102 can be constructed from silicone or a silicone-like material. The molded shield 102 can conduct heat away from electrical component 104 by absorbing heat and transferring heat to other surfaces. In another embodiment, the molded shield 102 can include additives to increase the ability to reduce electromagnetic interference (EMI) and radio frequency interference (RFI) emissions. Such additives can include copper, zinc, nickel and the like. Molded shield 102 can include a body with a top side 120, a bottom side 122 and four lateral sides 124. In one embodiment, molded shield 102 can include a component cavity to receive electronic component 104 and a slit to receive metal fence 108 on the bottom side 122. Molded shield 102 can be designed to contact electronic component 104 through the component cavity through at least one surface. Preferably, molded shield 102 can contact electronic component 104 on five surfaces (e.g., on the top surface and each of the four side surfaces of component 104). Contact between molded shield 102 and electronic component 104 can increase heat conduction from electronic component 104 to molded shield 102.

The top side 120 and lateral sides 124 of molded shield 102 can receive a metallic foil. The metallic foil can be stainless steel or any other type of metal. The metallic foil can be coupled to the molded shield 102 and can enhance the EMI and RFI attenuation aspects. In one embodiment, the foil can be 0.01 inches thick. In another embodiment, metallic foil can be replaced with relatively thicker 0.1 inch thick layer of metal. Molded shield 102 can couple to metal frame 108. When metal frame 108 is coupled to ground, the combination of molded shield 102 and metal layer on top side 120 and lateral sides 124 can reduce EMI and RFI emissions. Midplate 110 can be disposed above and in contact with molded shield 102. The midplate 110 can function as, among other things, a heat sink to molded shield 102 to further enhance heat dissipation.

Figure 2:
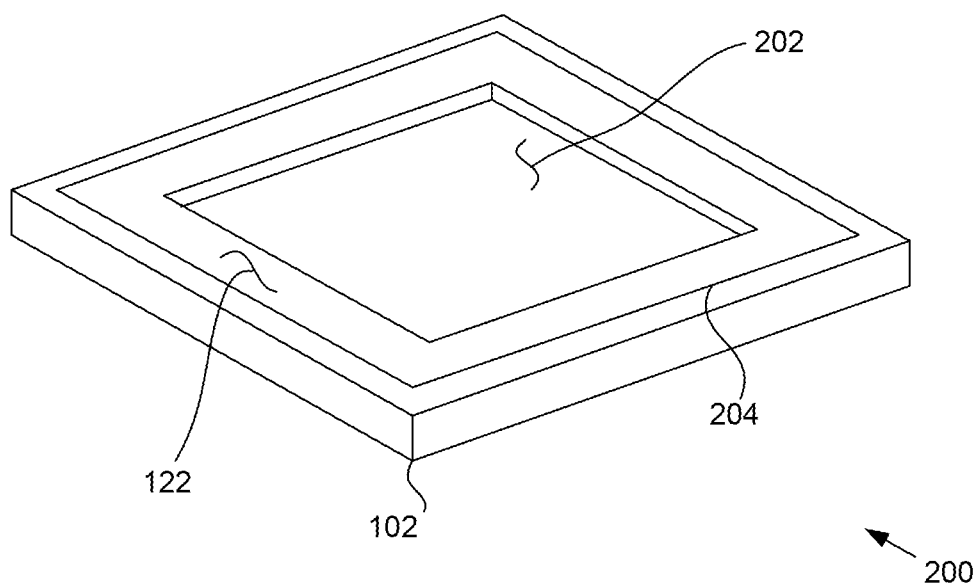
FIG. 2 shows one embodiment of bottom side 122 of a molded shield.

FIG. 2 shows one embodiment of bottom side 122 of molded shield 102. Bottom side 122 can include component cavity 202 and slit 204. Component cavity 202 can be configured to receive electrical component 104. In one embodiment, component cavity 202 can come into direct and continuous contact with electrical component 104 when placed over electrical component 104. Slit 204 can be configured to receive metal frame 108. In one embodiment, slit 204 can come into direct and continuous contact with metal frame 108. In one embodiment, the slit can be formed by cutting into molded shield 102. In another embodiment, the slit can be molded into the molded shield 102.

Figure 3:
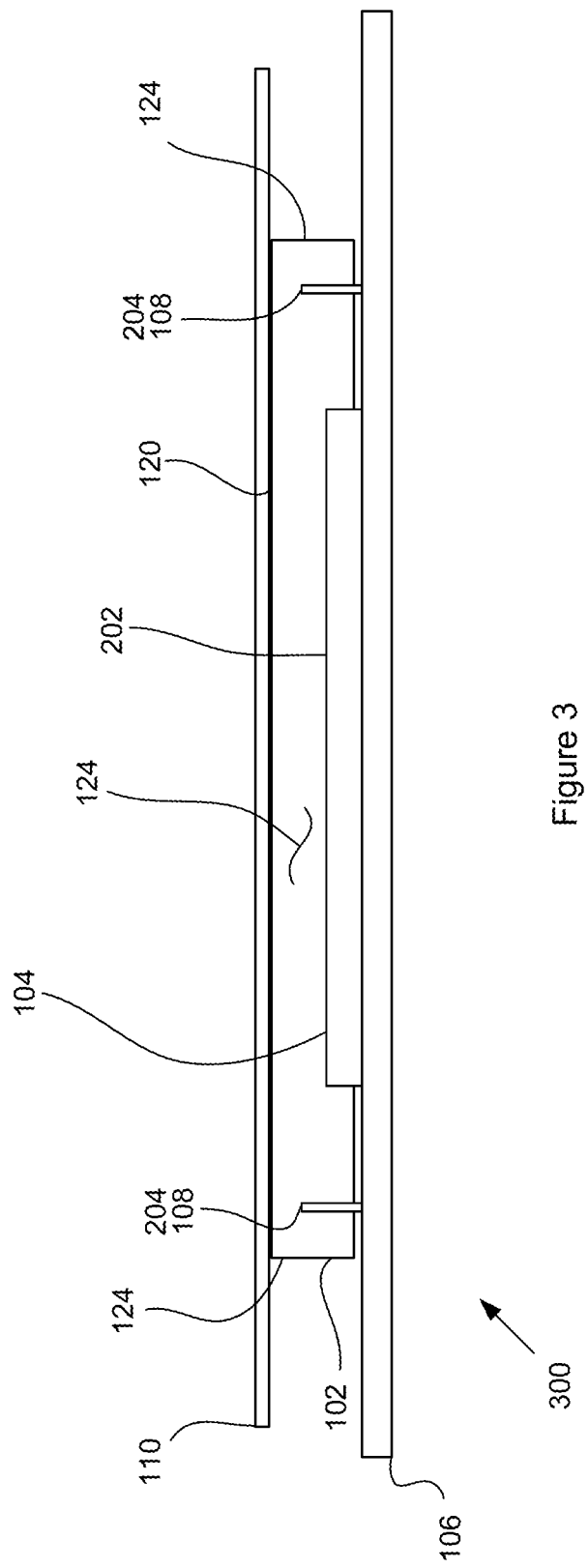
FIG. 3 shows a cross sectional view of one embodiment of the shield system.

FIG. 3 shows a cross sectional view 300 of one embodiment of shield system 100. Electrical component 104 can be affixed to one side of PCB 106. Metal frame 108 can also be affixed to the same side of PCB 106. In one embodiment, metal frame 108 can be coupled to a potential signal such as a ground signal. In another embodiment, metal frame 108 can be coupled to a power plane such as VCC. Molded shield 102 can include a cavity 202 to accommodate electrical component 104 as well as slits 204 to accommodate metal frame 108. Top side 120 and lateral sides 124 of molded shield 102 can receive a metal foil to help further attenuate EMI/RFI emissions.

Figure 4:
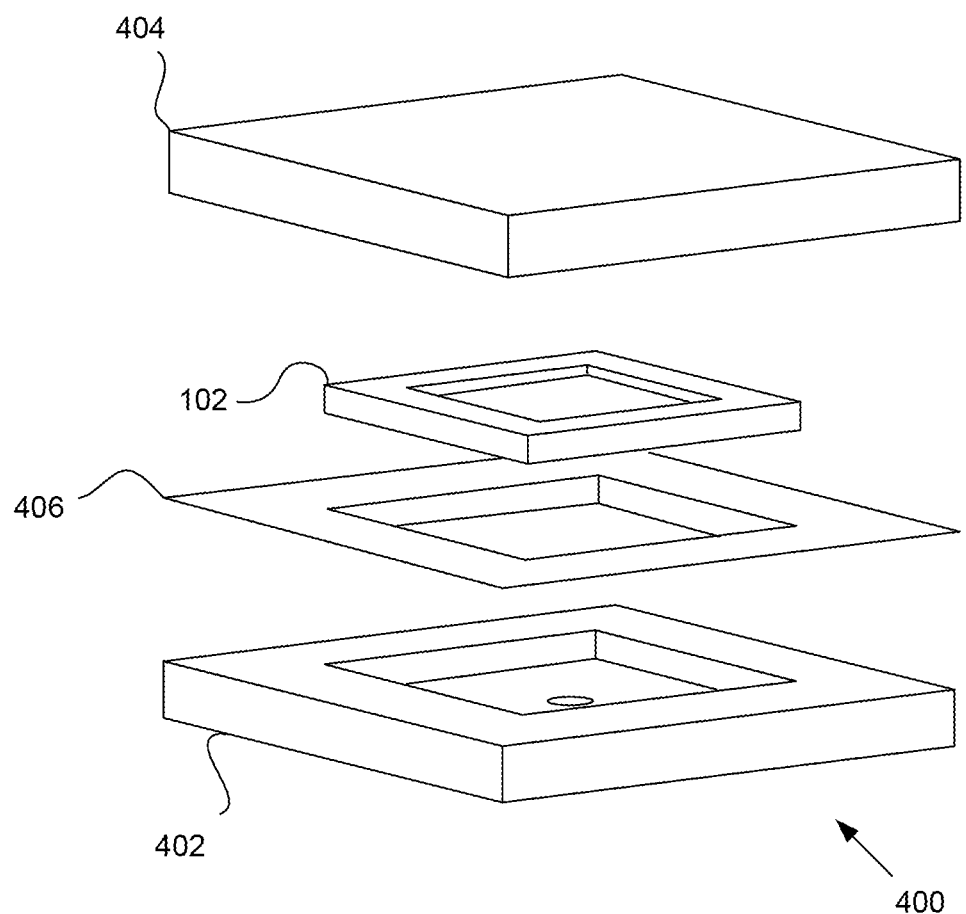
FIG. 4 is one embodiment of a mold that can be used to form a molded shield.

FIG. 4 is one embodiment of a mold 400 that can be used to form molded shield 102. Mold 400 can be a compression mold and include core 402 and cavity 404. The core 402 can be configured to conform to desired external dimensions of molded shield 102. In one embodiment, core 402 can form top side 120 and lateral sides 124 of molded shield 102. Cavity 404 can form component cavity 202. In one embodiment, cavity 404 can also form a chamfer for slit 204. Slit 204 can be further formed by cutting along the chamfer after the molding process. Metal foil 406 can be inserted into mold 400 prior to molding molded shield 102.

Figure 5:
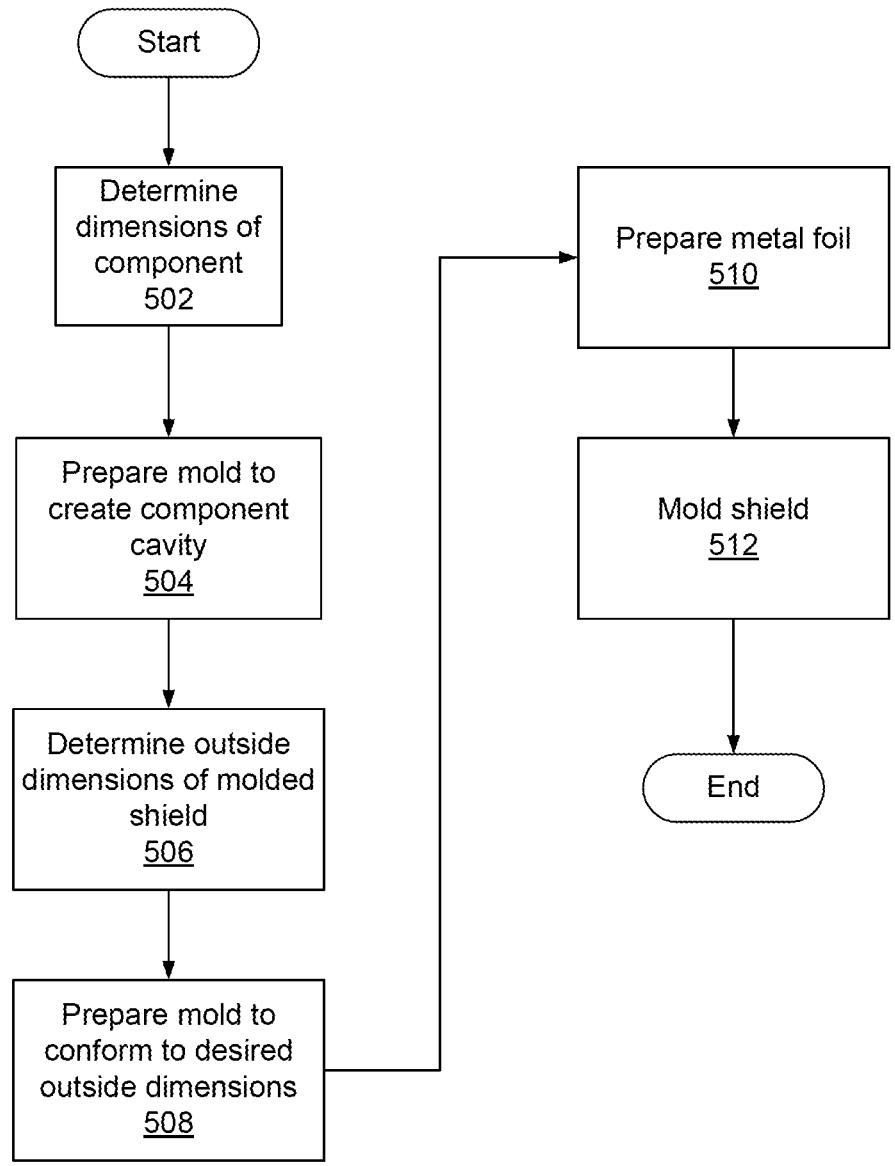
FIG. 5 is a flowchart of method steps for forming a molded shield.

FIG. 5 is a flowchart of method steps for forming molded shield 102. The method begins in step 502 by determining the dimensions of the electrical component 104 that is to be fitted under molded shield 102. In step 504, the mold 400 can be prepared to create a component cavity 202 conforming to the dimensions of the electrical component 104. In step 506, desired outside dimensions of molded shield 102 can be determined. For example, molded shield 102 can be larger than electrical component 104 and also large enough to contact metal frame 108. The finished height of molded shield 102 can be determined, at least in part by height of electrical component 104, metal frame 108 and desired height above PCB 106. In step 508, the mold 400 can be prepared to create a molded shield conforming to the desired outside dimensions.

In step 510, metal foil 406 can be prepared. In one embodiment, metal foil 406 can be inserted into mold 400 prior to introducing the silicone to form molded shield 102. In another embodiment, step 510 can be omitted. In yet another embodiment, a thin metal layer can be formed to fit over molded shield 102. In step 512, molded shield 102 can be formed in mold 400 and the method ends.

In other embodiments, molded shield can be configured to cover and contact more than one electrical component. For example, multiple ICs, or ICs in combination with other components such as resistors, capacitors, inductors, diode, transistors and the like can be covered with molded shield 102.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A shield system, the system comprising:
a printed circuit board, wherein the printed circuit board comprises a top surface and a bottom surface;
an electrical component affixed to the top surface of the printed circuit board;
a metal frame affixed to the top surface of the printed circuit board and surrounding the electronic component;
a silicone shield disposed on the electrical component, comprising:
a top surface;
at least two sidewalls joined by the top surface, wherein the at least two sidewalls define a cavity in the silicone shield, wherein the cavity is configured to accept the electrical component, wherein each of the sidewalls comprises opposing interior and exterior surfaces and a slit interposed between the interior and exterior surfaces, wherein the slit is configured to accept the metal frame, and wherein the top surface completely covers the cavity and the slit in each sidewall;
a metal layer arranged to conform to the top surface of the silicone shield, wherein the metal layer is disposed in direct contact with the top surface of the silicone shield; and
a midplate disposed above the top surface of the printed circuit board and above the metal layer.

2. The shield system of claim 1, wherein the cavity comes in direct contact with the electronic component on at least two surfaces of the electronic component.

3. The shield system of claim 1, wherein the bottom surface of the shield at the cavity comes in direct contact with a top surface and at least one side surface of the electronic component.

4. The shield system of claim 1, wherein the midplate comprises a heat sink.

5. The shield system of claim 1, wherein the silicone shield at the slit comes in direct contact with the metal frame.

6. A shield comprising:
a molded shield body comprising a top surface and at least two sidewalls joined by the top surface, wherein the at least two sidewalls define a cavity in the molded shield body, wherein the cavity is configured to accept an electrical component, wherein each of the sidewalls comprises opposing interior and exterior surfaces and a slit interposed between the interior and exterior surfaces, wherein the slit is configured to accept a frame, and wherein the top surface completely covers the cavity and the slit in each sidewall.

7. The shield of claim 6, wherein the slit surrounds the cavity and is separated from the cavity by a portion of the molded shield body.

8. The shield of claim 7, wherein the cavity is configured to receive the electrical component such that the sidewalls have continuous and direct contact with the electrical component.

9. The shield of claim 7, wherein the slit comprises inner surfaces, and wherein the slit is configured to receive a frame such that the inner surfaces of the slit have continuous and direct contact with the frame.

10. The system of claim 7, wherein the shield further comprises a sheet of metal foil that covers and conforms to the top surface and the at least two sidewalls of the molded shield body.

11. The system of claim 10, wherein the sheet of metal foil comprises stainless steel.

12. The system of claim 11, wherein the sheet of metal foil has a thickness that is at least 0.01 inches.

13. The shield of claim 6, wherein the molded shield body comprises silicone and additives to increase the ability to reduce electromagnetic and radio frequency interference.

14. The shield of claim 13, wherein the additives comprise at least one additive selected from the group consisting of: a copper additive, a zinc additive, and a nickel additive.

15. A system comprising:
a mounting surface;
an electrical component positioned above the mounting surface;
a frame positioned above the mounting surface and about at least a portion of the electronic component; and
a shield comprising:
a top surface and at least two sidewalls joined by the top surface, wherein the at least two sidewalls define a cavity in the shield, wherein the cavity is configured to receive the electrical component, wherein each of the sidewalls comprises opposing interior and exterior surfaces and a slit interposed between the interior and exterior surfaces, wherein the slit is configured to accept the frame, and wherein the top surface completely covers the cavity and the slit in each sidewall.

16. The system of claim 15, wherein the shield at the cavity directly contacts the received electrical component along at least one surface of the electrical component.

17. The system of claim 15, wherein the shield at the cavity directly contacts the received electrical component along a top surface of the electrical component and along at least one side surface of the electrical component.

18. The system of claim 15, wherein the shield at the slit directly contacts the received frame.

19. The system of claim 15, wherein the shield comprises silicone, and wherein the frame comprises metal.

20. The system of claim 15, further comprising at least one of a metal layer disposed in direct contact with the top surface of the shield and a heat sink disposed in direct contact with the top surface of the shield.

* * * * *